(12) United States Patent
Shimadu et al.

(10) Patent No.: US 8,917,495 B2
(45) Date of Patent: Dec. 23, 2014

(54) CIRCUIT BOARD PRODUCTION METHOD AND CIRCUIT BOARD

(75) Inventors: Hitoshi Shimadu, Higashiura-cho (JP); Takehiko Sawada, Tokoname (JP); Tomoaki Asai, Nagoya (JP); Ryou Yamauchi, Kasugai (JP)

(73) Assignee: Kabushiki Kaisha Toyota Jidoshokki, Aichi (JP)

( * ) Notice: Subject to any disclaimer, the term of this patent is extended or adjusted under 35 U.S.C. 154(b) by 364 days.

(21) Appl. No.: 13/393,392

(22) PCT Filed: Sep. 1, 2010

(86) PCT No.: PCT/JP2010/064952
§ 371 (c)(1),
(2), (4) Date: Feb. 29, 2012

(87) PCT Pub. No.: WO2011/027792
PCT Pub. Date: Mar. 10, 2011

(65) Prior Publication Data
US 2012/0160553 A1 Jun. 28, 2012

(30) Foreign Application Priority Data

Sep. 1, 2009 (JP) ................................ 2009-201877
Sep. 17, 2009 (JP) ................................ 2009-215150
Mar. 10, 2010 (JP) ................................ 2010-053244

(51) Int. Cl.
*H02B 1/20* (2006.01)
*H05K 3/02* (2006.01)
*H05K 1/16* (2006.01)
*H05K 3/20* (2006.01)
*H01F 27/28* (2006.01)
*H01F 27/30* (2006.01)

(52) U.S. Cl.
CPC .......... *H05K 1/165* (2013.01); *H05K 2203/175* (2013.01); *H01F 27/306* (2013.01); *H05K 3/202* (2013.01); *H01F 27/2847* (2013.01); *H05K 2201/10409* (2013.01); *H05K 2201/09672* (2013.01)
USPC ....... 361/639; 174/68.2; 174/70 B; 174/71 B; 361/611; 361/624; 29/847

(58) Field of Classification Search
CPC .......... H02G 3/00; H02G 5/00; H02G 5/005; H02G 5/007; H02G 5/025; H02B 1/20–1/21; H01R 9/2458; H01R 48/28; H05K 3/06; H05K 3/108; H05K 3/4069; H05K 3/386; H05K 2201/0355
USPC ........... 174/157, 261, 68.2, 70 B, 71 B, 72 B, 174/88 B, 99 B, 129 B, 133 B, 149 B; 361/611, 624, 637, 639, 648, 775; 29/825, 831, 846, 847; 307/147
See application file for complete search history.

(56) References Cited

U.S. PATENT DOCUMENTS 1,794,831 A 3/1931 Caruso
3,978,375 A 8/1976 Fukui et al.
(Continued)

FOREIGN PATENT DOCUMENTS

EP 0 096 516 A1 12/1983
(Continued)

OTHER PUBLICATIONS

Translation of Preliminary Report on Preliminary Report on Patentability for corresponding International Patent Application No. PCT/JP2010/064952 mailed Mar. 29, 2012.
(Continued)

*Primary Examiner* — Hoa C Nguyen
(74) *Attorney, Agent, or Firm* — Sughrue Mion, PLLC

(57) ABSTRACT

Provided is a circuit board manufacturing method capable of securing circuit patterns on a plate-like insulator while keeping the relative position between the circuit patterns, and also provided is a circuit board in which the relative position between a plurality of circuit patterns is kept. A first coil (30) having one turn is formed in a planar shape from a metal plate. Next, a second coil (40) having four turns is formed in a planar shape from a metal plate, wherein both of the ends (41, 42) of the coil are linked to other adjacent regions via linking portions (43, 44). A pair of the first coil (30) and the second coil (40) are then overlapped so as to face each other through a plastic plate (50) in which a plurality of prepregs are stacked, after which the links by the linking portions (43, 44) are disconnected.

9 Claims, 10 Drawing Sheets

(56) References Cited

U.S. PATENT DOCUMENTS

| | | | |
|---|---|---|---|
| 5,223,676 A * | 6/1993 | Yamamoto et al. | 174/250 |
| 6,008,982 A * | 12/1999 | Smith | 361/624 |
| 6,049,043 A * | 4/2000 | Tonejc | 174/250 |
| 6,748,651 B2 * | 6/2004 | Miyajima et al. | 29/845 |

FOREIGN PATENT DOCUMENTS

| | | |
|---|---|---|
| EP | 0 802 711 A2 | 10/1997 |
| JP | 03-021095 A | 1/1991 |
| JP | 3-21095 A | 1/1991 |
| JP | 05-013929 A | 1/1993 |
| JP | 5-243706 A | 9/1993 |
| JP | 8-186350 A | 7/1996 |
| JP | 2000-244075 A | 9/2000 |
| JP | 2001-6210 A | 1/2001 |
| JP | 2002-5059 A | 1/2002 |
| JP | 2002-50590 A | 2/2002 |
| JP | 2007-134393 A | 5/2007 |

OTHER PUBLICATIONS

International Search Report for PCT/JP2010/064952 dated Oct. 12, 2010.

Korean Office Action dated Jun. 12, 2013 issued in Korean Application No. 10-2012-7001993.

Extended European Search Report for corresponding EP Patent Application No. 10813741.5 dated Mar. 7, 2013.

* cited by examiner (A)

(B)

(A)

(B)

(A)

(B)

(A)

(B)

(A)

(B)

(A)

(B)

CIRCUIT BOARD PRODUCTION METHOD AND CIRCUIT BOARD

CROSS REFERENCE TO RELATED APPLICATIONS

This application is a National Stage of International Application No. PCT/JP2010/064952 filed Sep. 1, 2010, claiming priority based on Japanese Patent Application Nos. 2009-201877 filed Sep. 1, 2009, 2009-215150 filed Sep. 17, 2009 and 2010-053244 filed Mar. 10, 2010, the contents of all of which are incorporated herein by reference in their entirety.

TECHNICAL FIELD

The present invention relates to a circuit board production method and a circuit board.

BACKGROUND ART

The following patent document 1 discloses an electric system wiring board which is a conventional technology relating to circuit board production methods. The electric system wiring board has a structure where electrically conducting paths are respectively formed on front and back surfaces of a substrate formed in a plate shape from an insulating material.

RELATED ART DOCUMENTS

Patent Documents

Patent Document 1: Unexamined Japanese Patent Application Laid-Open No. 2007-134393

DISCLOSURE OF THE INVENTION

Problems to be Solved by the Invention

When electrically conducting paths formed beforehand are secured to a substrate to produce an electric system wiring board as disclosed in the document, an option is to secure a plurality of electrically conducting paths to one surface of the substrate. To mount parts between the electrically conducting paths or apply a high voltage to between the electrically conducting paths, it is necessary to keep a distance accuracy meeting a predefined value between the electrically conducting paths. Moreover, it is necessary that the electrically conducting paths be accurately located to connect the electrically conducting paths to any devices outside the board.

In the case of locating a plurality of electrically conducting paths independently from each other, however, a problem was conventionally presented; locating means, such as positioning pins, need to be additionally provided in the respective electrically conducting paths.

The present invention was accomplished to solve the conventional problem. A main object of the present invention is to provide a method for producing a circuit board structurally characterized in that a plurality of circuit patterns (electrically conducting paths) can be secured to an insulating member having a plate shape (substrate) with relative positions thereof unchanged, and a circuit board where relative positions of a plurality of circuit patterns remain unchanged.

Means for Solving the Problem

To achieve the object, a circuit board production method for producing a circuit board having a first circuit pattern and a second circuit pattern, includes: a first process for forming the first circuit pattern and the second circuit pattern in a manner that the first and second circuit patterns are coupled with each other by a first coupling section; a second process for securing the first circuit pattern and the second circuit pattern to an insulating member having a plate shape; and a third process for releasing the coupling by the first coupling section.

When the two circuit patterns are secured to the plate-shape insulating member in the second process, these circuit patterns are coupled with each other by the first coupling section. Therefore, the first circuit pattern and the second circuit pattern can be secured to the plate-shape insulating member without any relative positional shift therebetween.

The first process of the circuit board production method may employ die punching of a conductor having a plate shape to form the first circuit pattern and the second circuit pattern in the manner that the first and second circuit patterns are coupled with each other by the first coupling section.

The conductor can be punched by, for example, forward press into a shape where the first circuit pattern and the second circuit pattern are coupled by the first coupling section.

The first process may form a second coupling section used to couple two different portions in the first circuit pattern, and the third process releases the coupling by the first coupling section and the coupling by the second coupling section in the circuit board production method.

The formation of the coupling section is not necessarily limited to between different circuit patterns. The coupling section may be provided between two different points in a circuit pattern.

A circuit pattern having a coil shape, for example, may be provided with a coupling section as a rib for shape stability or as a reinforcing member for preventing deformation of a long and thin circuit pattern under its own weight.

Die punching of a conductor having a plate shape may be employed to form the first circuit pattern and the second circuit pattern in the manner that the first and second circuit patterns are coupled with each other by the first coupling section in the circuit board production method.

The third process in the circuit board production method may include punching out the first coupling section or the first and second coupling sections by die punching to release the coupling by the coupling section.

The circuit board production method may further include forming a through hole which allows a die punching tool to pass through in the insulating member having a plate shape prior to the second process.

During the die punching to release the coupling section, the circuit patterns alone can be punched out.

A mounting pad for mounting an electronic part may be provided in each of the first circuit pattern and the second circuit pattern, and the first process forms the mounting pads in the circuit board production method.

The electronic part mounting pads can be formed during the die punching of the first and second circuit patterns.

A circuit board in which a first circuit pattern and a second circuit pattern are secured to an insulating member having a plate shape, wherein the first circuit pattern and the second circuit pattern formed by die punching of a conductor having a plate shape in a manner that the first and second circuit patterns are coupled with each other by a first coupling section are secured to the insulating member, and the first coupling section is then removed to electrically isolate the first circuit pattern and the second circuit pattern from each other.

Since the first circuit pattern and the second circuit pattern are coupled with each other and secured to the insulating member having a plate shape, relative positions of the first circuit pattern and the second circuit pattern remain unchanged.

The circuit board may further include a second coupling section used to couple two different portions in the first circuit pattern, wherein the coupling by the second coupling section is released after the first and second circuit patterns are secured to the insulating member.

The insulating member having a plate shape of the circuit board may have a through hole which allows a die punching tool used to release the coupling by the first coupling section or the second coupling section to pass through.

A mounting pad for mounting an electronic part may be formed in each of the first circuit pattern and the second circuit pattern in the circuit board.

The relative positions of the mounting pads each used to mount an electronic part remain unchanged. Further, a degree of planarity is maintained in mounting surfaces of the mounting pads because the first circuit pattern and the second circuit pattern are formed from the same plate-shape conductor.

Effect of the Invention

The present invention provides a method for producing a circuit board structurally characterized in that a plurality of circuit patterns (electrically conducting paths) can be secured to an insulating member having a plate shape (substrate) with relative positions thereof unchanged, and a circuit board where relative positions of a plurality of circuit patterns remain unchanged.

MODES FOR CARRYING OUT THE INVENTION

Exemplary Embodiment 1

Hereinafter, an exemplary embodiment 1 in which a circuit board and a circuit board production method according to the present invention are embodied is described referring to the accompanied drawings.

Figure 1:
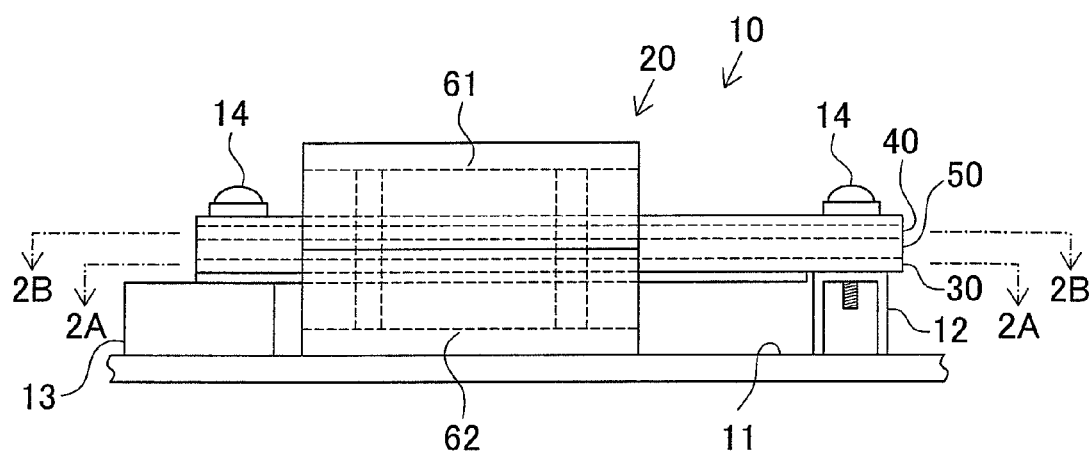
FIG. 1 is a side view conceptually illustrating main structural elements of a circuit board according to an exemplary embodiment 1.

A circuit board 10 illustrated in FIG. 1 is provided with a transformer 20 having a first coil 30 and a second coil 40 and formed in a planar shape from a copper plate having a predefined thickness (for example, 0.6 to 0.8 mm) to deal with high currents (for example, 50 to 180 A). The transformer 20 has a structure where cores 61 and 62 are vertically mounted on a coil member in which the coils 30 and 40 are insulated from both surfaces thereof by a resin plate 50 functioning as an insulating member having a plate shape. The transformer 20 thus structured performs voltage transformation in which a voltage input to an input terminal is transformed and output from an output terminal.

The transformer 20 is fastened to a terminal table 12 and a support table 13 by means of screws 14 so that a part of input terminals and output terminals exposed on a lower surface from the resin plate 50 is electrically connected to predefined terminals provided on the terminal table 12 on a plate surface 11. For fastening, the circuit board 10 has six through holes $21a$ to $21f$ (see FIGS. 2 (A) and 2 (B)) for the screws 14 to be inserted through.

As illustrated in FIG. 2(A), the first coil 30 is formed in a plate shape and has the winding number of 1. An end portion of the first coil 30 on one side thereof and an end portion of the first coil 30 on the other side thereof are formed so as to serve as two terminals 71 and 72 constituting the input terminals. These input terminals 71 and 72 are formed such that portions thereof exposed from the resin plate 50 (hereinafter, called exposed portions $71a$ and $72a$) are smaller than other portions near the exposed portions. Moreover, the input terminals 71 and 72 have through holes $21a$ and $21b$ for the screws 14 to be inserted through.

Two terminals 73 and 74 constituting the output terminals are provided on a plane including the input terminal 71. These output terminals 73 and 74 are electrically connected to an end portion 41 of the second coil 40 on one side thereof and an end portion 42 of the second coil 40 on the other side thereof, which will be described later, via an electrode unit not illustrated in the drawings. The electrode unit may be, for example, a penetration electrode, or may be formed by making a part of the output terminals 73 and 74 and the end portions 41 and 42 respectively protrude toward the other ones so that surfaces of the protruding portions contact with each other.

The output terminals 73 and 74 are formed such that portions thereof exposed in a longitudinal direction from the resin plate 50 (hereinafter, called exposed portions $73a$ and $74a$) are smaller than other parts near the exposed portions. The output terminals 73 and 74 have through holes $21c$ and $21d$ for the screws 14 to be inserted through. Annular protruding portions are provided around the through holes $21a$ to $21d$ of the terminals 71 to 74 on the side of the terminal table to prevent resin from penetrating into any electrically conductive parts.

Metal seats $75e$ and $75f$ both formed from a metallic member of the same material and serving to prevent loosening of the screws are provided on a plane flush with the first coil 30. The metal seats 75e and 75f respectively have, at centers thereof, through holes 21e and 21f for the screws 14 to be inserted through. When the metal seats 75e and 75f are provided in the portions for the screws 14 to be inserted through, an amount of resin used in the portions to be fastened is lessened. This prevents the unfavorable event that the screws are loosened due to deformation of the portions where the resin is used.

Figure 2:
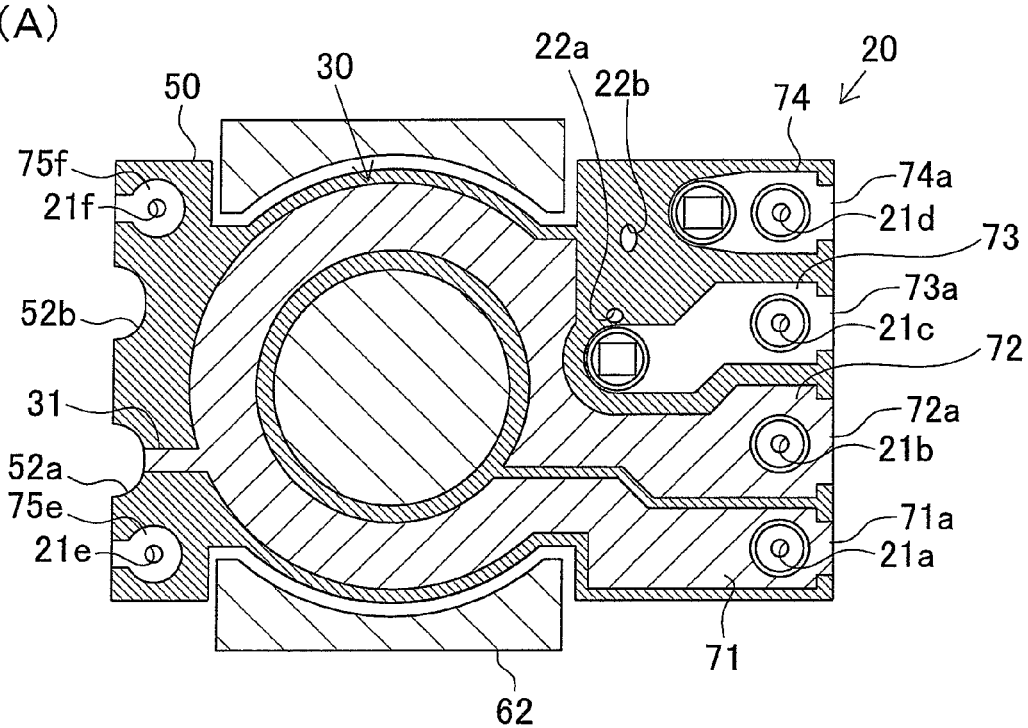
FIG. 2 (A) is a sectional view cut along 2A-2A line illustrated in FIG. 1, and FIG. 2 (B) is a sectional view cut along 2B-2B line illustrated in FIG. 1.
Figure 2:
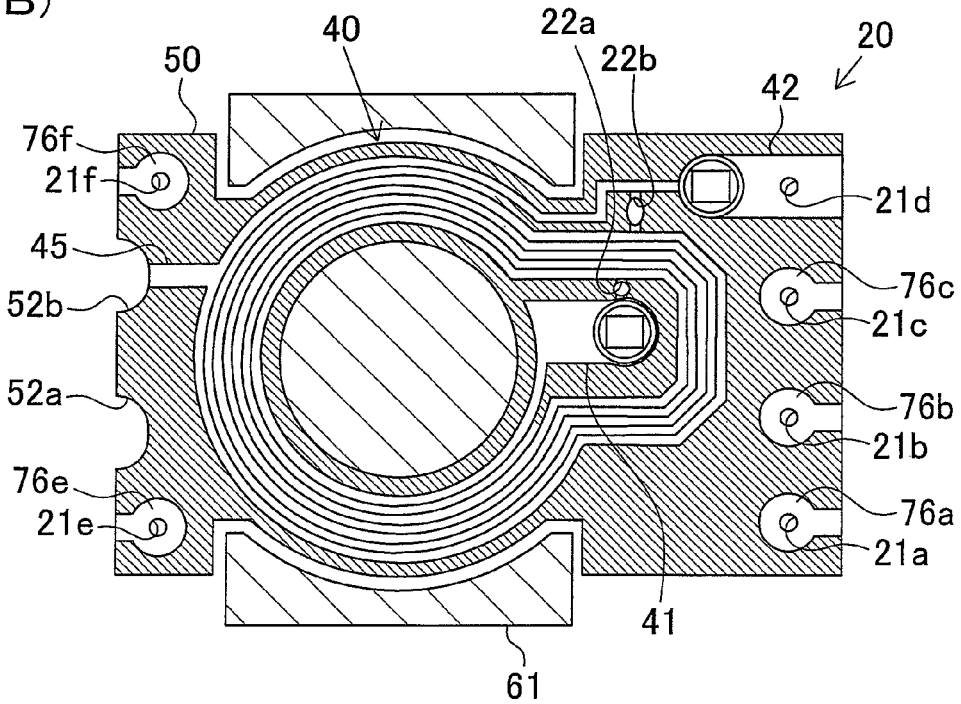

As illustrated in FIG. 2 (B), the second coil 40 is formed in a plate shape and has the winding number of 4. To enable electrical connection to the output terminals 73 and 74, end portions of the second coil 40 are formed as the one-side end portion 41 and the other-side end portion 42 in the vicinity of where the output terminals 73 and 74 are projected on a plane including the second coil 40. The other-side end portion 42 has a through hole 21d for the screws 14 to be inserted through. Metal seats 76a, 76b, 76c, 76e, and 76f are provided on a plane flush with the second coil 40. The seats 76a, 76b, 76c, 76e, and 76f are all formed from a metallic member of the same material and serve to prevent loosening of the screws similarly to the metal seats 75e and 75f. The metal seats 76a, 76b, 76c, 76e, and 76f respectively have, at centers thereof, through holes 21a, 21b, 21c, 21e, and 21f for the screws 14 to be inserted through. For the sake of simplicity, FIG. 2 does not include shaded illustration of the second coil 40 and the output terminals 73 and 74 in cross section. As illustrated in FIG. 2 (B), the second coil 40 is formed so as to ensure a distance large enough to meet a required insulation distance from inner and outer edges of the resin plate 50. Regardless of any positional shift of the cores 61 and 62 when they are vertically mounted, there is still an enough insulation distance between the second coil 40 and the cores 61 and 62.

Figure 3:
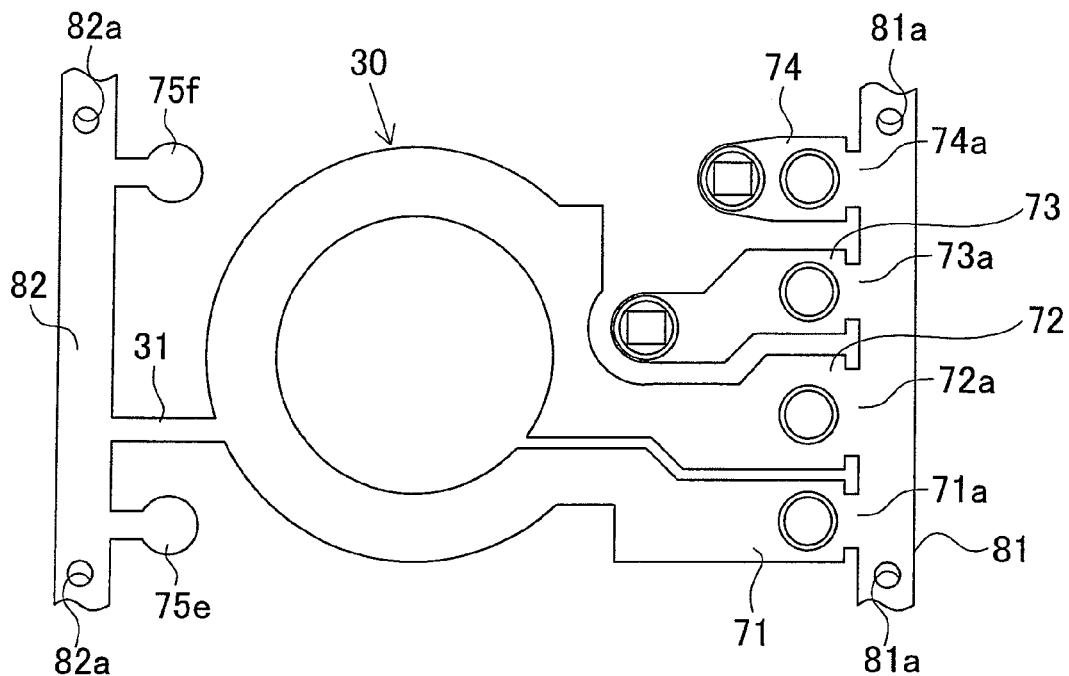
FIGS. 3(A) and 3(B) are process drawings illustrating a part of production processes of the circuit board according to the exemplary embodiment 1.
Figure 3:
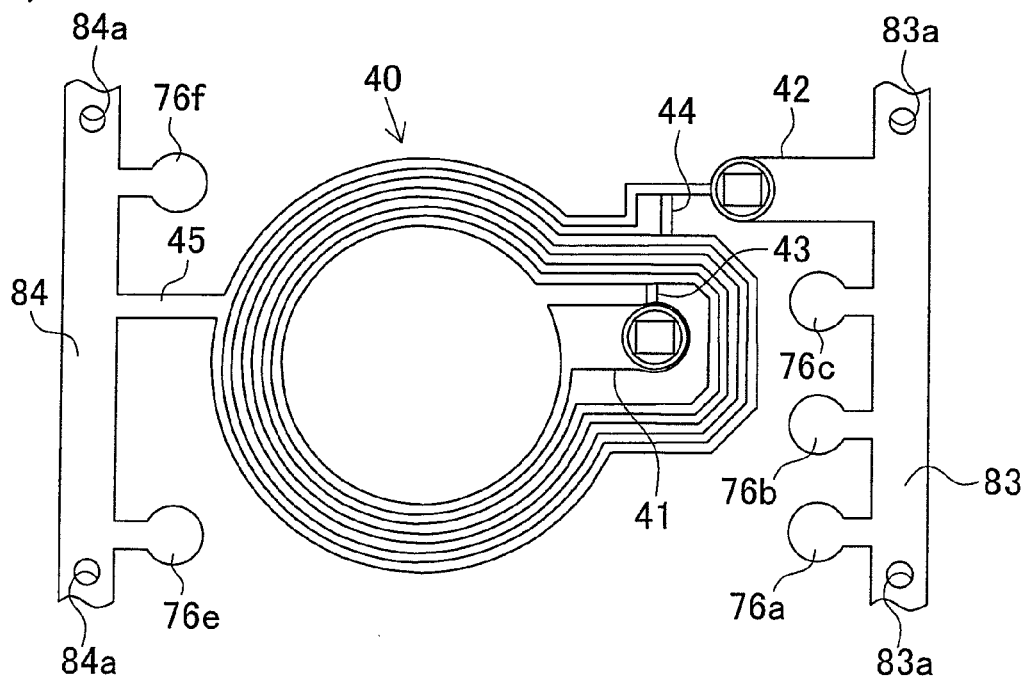
Figure 4:
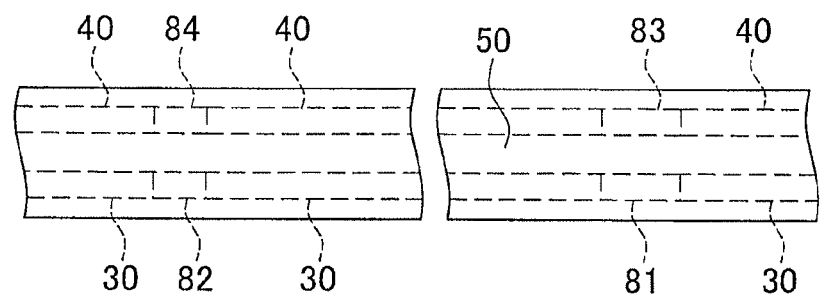
FIGS. 4(A) and 4(B) are process drawings illustrating a part of the production processes of the circuit board according to the exemplary embodiment 1.
Figure 4:
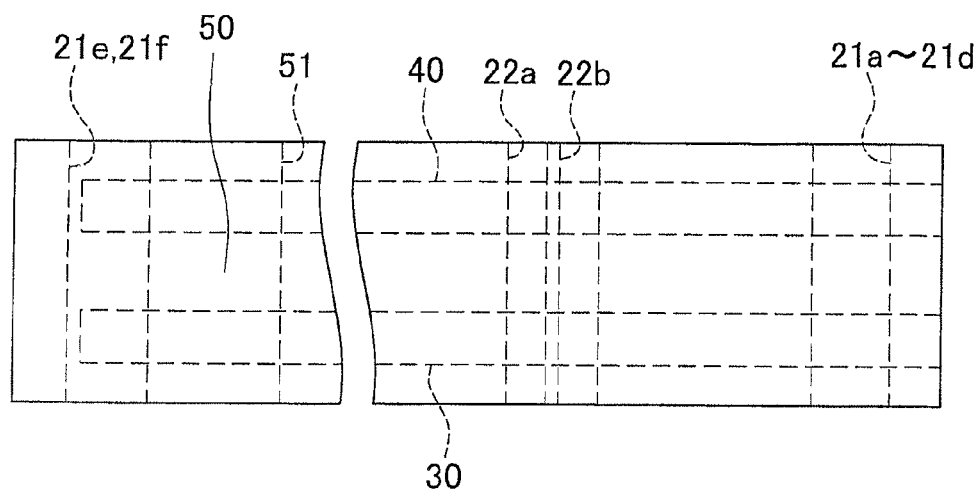

Next, production processes of the circuit board 10 thus structurally characterized are described referring to FIGS. 3 and 4.

First, a copper plate having a predefined shape is prepared as a plate-shape conductor used as a base material. As illustrated in FIG. 3 (A), a plurality of the first coils 30 each having the winding number of 1 and a plurality of the output terminals 73 and 74 are formed in a planar shape by press work. The one-side end portion and the other-side end portion of the first coil 30 (input terminals 71 and 72) and end portions of the output terminals 73 and 74 (end portions on right side illustrated in FIG. 3 (A)) are coupled by a support member 81. The support member 81 further couples the output terminals 73 and 74 and the other first coils 30 plurally formed at the same time. The support member 81 has two positioning through holes 81a formed near the input terminal 71 and the output terminal 74. The portions constituting the exposed portions 71a, 72a, 73a, and 74a are formed in smaller dimensions than other portions near the exposed portions.

End portions of the metal seats 75e and 75f (end portions on left side illustrated in FIG. 3 (A)) are coupled by a support member 82. The first coil 30 is coupled with the support member 82 by a coupling section 31 formed near the support member 82. The support member 82 further couples the metal seats 75e and 75f and the other first coils 30 plurally formed at the same time. The support member 82 has two positioning through holes 82a formed near the metal seats 75e and 75f. The process illustrated in FIG. 3 (A) is an example of the "first process" recited in the Scope of Claims, and the support members 81 and 82 are each an example of the "first coupling section" recited in the Scope of Claims.

Then, a copper plate having a predefined shape is prepared as a plate-shape conductor used as a base material. As illustrated in FIG. 3 (B), a plurality of the second coils 40 each having the winding number of 4 and a plurality of the metal seats 76a, 76b, 76c, 76e, and 76f are formed in a planar shape by press work. In the process of forming these structural elements, the one-side end portion 41 is coupled with a portion adjacent thereto by a coupling section 43, while the other-side end portion 42 is coupled with a portion adjacent thereto by a coupling section 44. The coupling sections 43 and 44 are provided such that their projection onto a plane including the first coil 30 is away from the first coil 30 by at least a predefined distance when mounted on the resin plate 50 as described later. The coupling sections 43 and 44 are each an example of the "second coupling section" recited in the Scope of Claims.

The other-side end portion 42 of the second coil 40 and end portions of the metal seats 76a to 76c (end portions on right side illustrated in FIG. 3 (B)) are coupled by a support member 83. The support member 83 further couples the metal seats 76a to 76c and the other second coils 40 plurally formed at the same time. The support member 83 has two positioning through holes 83a formed near the other-side end portion 42 and the metal seat 76a.

End portions of the metal seats 76e and 76f (end portions on left side illustrated in FIG. 3 (B)) are coupled by a support member 84. The second coil 40 is coupled with the support member 84 by a coupling section 45 formed near the support member 84. The support member 84 further couples the metal seats 76e and 76f and the other second coils 40 plurally formed at the same time. The support member 84 has two positioning through holes 84a formed near the meal seats 76e and 76f. The process illustrated in FIG. 3 (B) is an example of the "first process" recited in the Scope of Claims, and the support members 83 and 84 are each an example of the "first coupling section" recited in the Scope of Claims. The first coil 30 and the second coil 40 may be formed in the same production process.

As illustrated in FIG. 4 (A), a plurality of resins, for example, prepregs, are stacked in a predefined number of layers, and the plural first coils 30 coupled by the support member 81 and the support member 82 are aligned on top of the layered prepregs. Similarly, a plurality of prepregs are stacked in a predefined number of layers, and the plural second coils 40 coupled by the support member 83 and the support member 84 are aligned on top of the layered prepregs. Then, a plurality of prepregs are further stacked in a predefined number of layers thereon to form a circuit board. In the process of forming the circuit board, positioning pins are inserted through the through holes 81a to 84a and a plurality of through holes formed in the prepregs so as to positionally match the through holes 81a to 84a. Then, the plural first coils 30 are located coplanarly on a plane at predefined positions on the layered prepregs, and the plural second coils 40 are located coplanarly on another plane at predefined positions on the layered prepregs. Accordingly, a pair of the first and second coils 30 and 40 is mounted facing each other with the resin plate 50 interposed therebetween. The resin plate 50 is formed with the prepregs provided thereon in multiple layers to smoothly electrically insulate the coils 30 and 40 each formed in such a thickness that can deal with high currents.

In the process illustrated in FIG. 4 (A), when the coils 30 and 40 are mounted with the resin plate 50 interposed therebetween, the one-side end portion 41 and the other-side end portion 42 of the second coil 40 are respectively coupled with other portions adjacent thereto by the coupling sections 43 and 44. This structural feature enables the second coil 40 to be easily mounted on the resin plate 50 without wobbling the end portions 41 and 42. The first coil 30 and the output terminals 73 and 74 are coupled by the support member 81, and the first coil 30 and the metal seats 75*e* and 75*f* are coupled by the support member 82. This structural feature enables the first coil 30, metal seats 75*e* and 75*f*, and output terminals 73 and 74 to be easily located at predefined positions on the layered prepregs (resin plate) without changing relative positions of these structural elements. Similarly, the second coil 40 and the metal seats 76*a* to 76*c* are coupled by the support member 83, while the second coil 40 and the metal seats 76*e* and 76*f* are coupled by the support member 84. Therefore, the second coil 40 and the metal seats 76*a* to 76*c*, 76*e*, and 76*f* can be easily located on the layered prepregs (resin plate) with relative positions of these structural elements unchanged. The process illustrated in FIG. 4 (A) is an example of the "second process" recited in the Scope of Claims. The first coil 30 and at least one of the output terminals 73 and 74 coupled with the first coil 30 by the support member 81 can respectively represent the "first circuit pattern" and the "second circuit pattern" recited in the Scope of Claims. The first coil 30 and at least one of the metal seats 75*e* and 75*f* coupled with the first coil 30 by the support member 82 can respectively represent the "first circuit pattern" and the "second circuit pattern" recited in the Scope of Claims. The second coil 40 and at least one of the metal seats 76*a*, 76*b*, and 76*c* coupled with the second coil 40 by the support member 83 can respectively represent the "first circuit pattern" and the "second circuit pattern" recited in the Scope of Claims. The second coil 40 and at least one of the metal seats 76*e* and 76*f* coupled with the second coil 40 by the support member 84 can respectively represent the "first circuit pattern" and the "second circuit pattern" recited in the Scope of Claims.

As illustrated in FIG. 4 (B), segmenting the resin plate 50 into pieces each having a pair of first and second coils 30 and 40, releasing the coupling by the coupling section 43 and the coupling by the coupling section 44, and removing the support members 81 to 84 are all carried out in the same production process by forward press. More specifically, through holes 22*a* and 22*b* for releasing the coupling by the coupling section 43 and the coupling by the coupling section 44, for example, are formed in the resin plate 50 by means of a first press die. Then, a part or the whole of the coupling sections 43 and 44 are cut off and removed. Next, through holes 21*a* to 21*f* for the screws 14 to be inserted through and core insertion holes 51 are formed in the resin plate 50 by means of a next press die.

Then, the coupling section 31 and the coupling section 45 are cut away by a last press die to remove the support members 81 to 84, and the resin plate is cut to be segmented into pieces so as to obtain a predefined outer shape to produce coil members each having a pair of first and second coils 30 and 40. A part of the cut surface of the resin plate 50 when the resin plate is segmented into pieces from which the portion where the coupling section 31 was cut off after the removal of the support member 82, 84 is exposed is dented to constitute a dented portion 52*a*, and a part of the cut surface of the resin plate 50 from which the portion where the coupling section 45 was cut off after the removal of the support member 82, 84 is exposed is dented to constitute a dented portion 52*b* (see FIG. 2).

In the process illustrated in FIG. 4 (B), the work to release the coupling by the coupling section 43 and the coupling by the coupling section 44 and the work to remove the support members 81 to 84 are carried out by forward press in the production process where the segmenting work is carried out. Therefore, it is unnecessary to separately provide an additional process for releasing the coupling by the coupling section 43 and the coupling by the coupling section 44 and a process for removing the support members 81 to 84. Such a streamlined process can avoid deterioration of a workability possibly caused by providing the coupling sections 43 and 44 and the support members 81 to 84. The segmenting process may employ the same press die as used in the process for releasing the coupling by the coupling section 43 and the coupling by the coupling section 44 or the process for removing the support members 81 to 84, or the segmenting process may be carried out in a process different from the process illustrated in FIG. 4 (B). The process illustrated in FIG. 4 (B) is an example of the "third process" recited in the Scope of Claims.

When the cores 61 and 62 are vertically mounted on the segmented coil member, the production of the transformer 20 (circuit board 10) illustrated in FIG. 1 is completed.

As described so far, according to the production method of the circuit board 10 provided by the exemplary embodiment 1, the process illustrated in FIG. 3 (A) forms the first coil 30 having the winding number of 1 in a planar shape from a metal plate, the process illustrated in FIG. 3 (B) forms the second coil 40 having the winding number of 4 in a planar shape from a metal plate, wherein the both end portions 41 and 42 of the coil are coupled with other portions in the same pattern by the coupling sections 43 and 44, the process illustrated in FIG. 4 (C) stack a plurality of pairs of first and second coils 30 and 40 in layers in an aligned manner so as to face each other with the resin plate 50, where a plurality of prepregs are layered, interposed therebetween, and the process illustrated in FIG. 4 (D) removes the support members 81 to 84 and releases the coupling by the coupling section 43 and the coupling by the coupling section 44.

The both end portions 41 and 42 of the second coil 40 are coupled with other sections in the same pattern by the coupling sections 43 and 44. Therefore, when the coils 30 and 40 are mounted with the resin plate 50 interposed therebetween in the process illustrated in FIG. 4 (C), the second coil 40 having a large winding number can be easily mounted on the resin plate 50 without any wobble of the both end portions 41 and 42.

According to the production method of the circuit board 10 provided by the exemplary embodiment 1, in the process illustrated in FIG. 4 (D), releasing the coupling by the coupling section 43 and the coupling by the coupling section 44 and segmenting the resin plate 50 into pieces each including a pair of first and second coils 30 and 40 are carried out in the same production process. Thus, the work to release the coupling by the coupling section 43 and the coupling by the coupling section 44 is carried out in the production process where the segmenting work is carried out by forward press. Therefore, it is unnecessary to separately provide an additional process for releasing the coupling by the coupling section 43 and the coupling by the coupling section 44 and a process for segmenting the resin plate. Such a streamlined process can avoid deterioration of a workability possibly caused by providing the coupling sections 43 and 44.

According to the production method of the circuit board 10 provided by the exemplary embodiment 1, the input terminals 71 and 72, which concurrently serve as the one-side end portion and the other-side end portion of the first coil 30, are formed so that the exposed portions 71*a* and 72*a*, which are the portions to be cut off during the segmenting work, are smaller than the other sections near the exposed portions. Therefore, when, for example, the conductors constituting the first coils 30 are mounted in proximity on the same plane on the resin plate 50 for dimensional reduction, an enough creepage distance for insulation can be reliably obtained between the exposed portions 71*a* and 72*a* exposed from the resin plate 50.

According to the production method of the circuit board 10 provided by the exemplary embodiment 1, the support members 81 and 82 are provided with a plurality of positioning through holes 81a and 82a. Therefore, when positioning pins, for example, are inserted through the through holes 81a and 82a and a plurality of through holes provided in the prepregs so as to positionally match the through holes 81a and 82a in the process illustrated in FIG. 4 (C), the first coil 30 and the support members 81 and 82 can be located with a required accuracy at predefined positions on the resin plate 50 where the prepregs are stacked in layers.

According to the production method of the circuit board 10 provided by the exemplary embodiment 1, the support members 83 and 84 have a plurality of positioning through holes 83a and 84a. Therefore, when positioning pins, for example, are inserted through the through holes 83a and 84a and a plurality of through holes provided in the prepregs so as to positionally match the through holes 83a and 84a in the process illustrated in FIG. 4 (C), the second coil 40 and the support members 83 and 84 can be located at predefined positions with a required accuracy on the resin plate 50 where the prepregs are stacked in layers.

According to the production method of the circuit board 10 provided by the exemplary embodiment 1, the process illustrated in FIG. 4 (D) dents a part of the cut surface of the resin plate 50 from which the portion where the coupling section 31 was cut off after the removal of the support member 82, 84 is exposed to form the dented portion 52a, and also dents a part of the cut surface of the resin plate 50 from which the portion where the coupling section 45 was cut off after the removal of the support member 82, 84 is exposed to form the dented portion 52b. Therefore, there is a certainly enough clearance between the cut portion and other conductive member, for example, a cabinet.

As a modified example 1 of the exemplary embodiment 1, the first coil 30 may be omitted to form the coil member or the circuit board provided with the second coil 40 alone as a coil. In the coil member or the circuit board having no transformer but just one coil, the process illustrated in FIG. 3 (B) forms the second coil 40, and the process illustrated in FIG. 4 (D) subsequent to the process illustrated in FIG. 4 (C) performs the work to remove the support members 81 to 84 to release the coupling by the coupling section 43 and the coupling by the coupling section 44 in the production process where the segmenting work is carried out. Then, similarly to the exemplary embodiment 1, the second coil 40 can be easily mounted on the resin plate 50, and a coil member or a circuit board provided with a coil that can deal with high currents can be easily produced.

According to a modified example 2 of the exemplary embodiment 1, the circuit board 10 may be provided with the transformer 20 structured so that the first and second coils 30 and 40 are coplanarly mounted. More specifically, the transformer 20 is formed to have, for example, a structure where the second coil 40 is provided around the first coil 30. This structural feature can combine the processes illustrated in FIG. 3 (A) and FIG. 3 (B) into one process, in which the first coil 30 and the second coil 40 are coupled by coupling members made of the same material. Then, the process illustrated in FIG. 4 (D) subsequent to the process illustrated in FIG. 4 (C) cuts off a part or the whole of the coupling sections. Thus configured, the first and second coils 30 and 40 can be easily mounted on the resin plate 50, and a circuit board provided with a transformer that can deal with high currents can be easily produced similarly to the exemplary embodiment 1.

Another suggested structure is; a circuit pattern (first circuit pattern) is the second coil 40, both end portions of the coil or portions adjacent thereto are coupled with another pattern adjacent thereto (second circuit pattern) by coupling sections, and the first coil 30 is secured to a surface of the resin plate 50 opposite to a surface where the second coil 40 (first circuit pattern) and the second circuit pattern are secured. According to the suggested structure, the first coil 30 and the second coil 40 are punched out from a material metal plate having a predefined shape, and the first coil 30, and second coil 40, and second circuit pattern are formed in a planar shape in the processes illustrated in FIGS. 3 (A) and (B), and the first coil 30, the second coil 40, and second circuit pattern are mounted facing one another with the resin plate 50 interposed therebetween in the process illustrated in FIG. 4 (C). Then, the process illustrated in FIG. 4 (D) carries out; removing the support members 81 to 84, releasing the couplings by the coupling sections, and segmenting the resin plate 50 into pieces each having a pair of first and second coils 30 and 40 in the same production process.

Exemplary Embodiment 2

Figure 5:
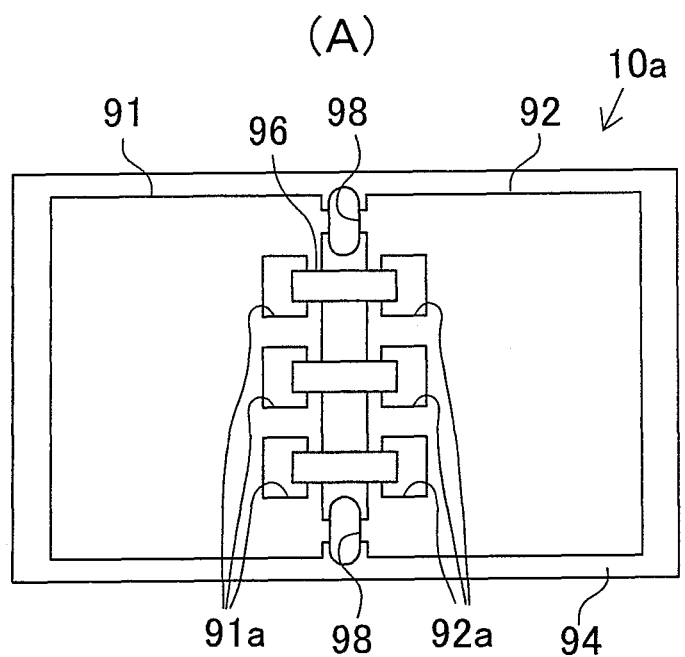
FIG. 5 are illustrations of a circuit board according to an exemplary embodiment 2, wherein FIG. 5 (A) is a front view, and FIG. 5 (B) is a side view.
Figure 5:
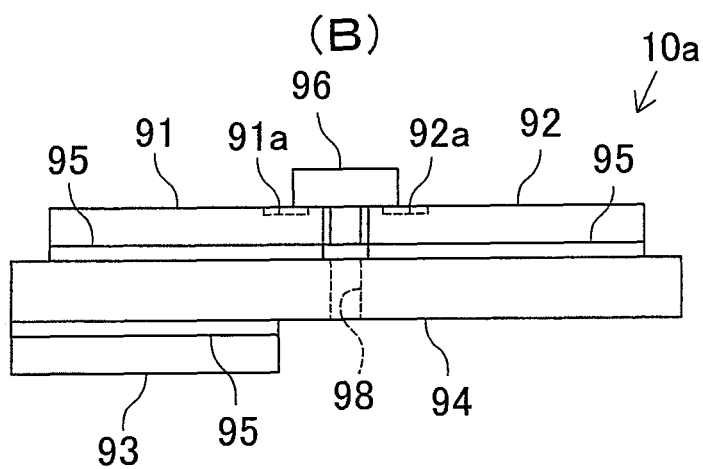
Figure 6:
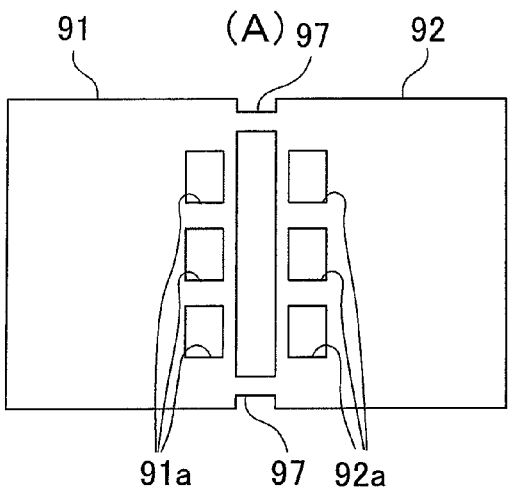
FIGS. 6(A), 6(B) and 6(C) are process drawings illustrating production processes of the circuit board according to the exemplary embodiment 2.
Figure 6:
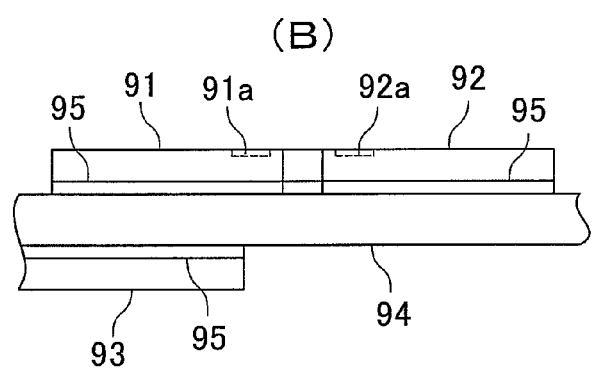
Figure 6:
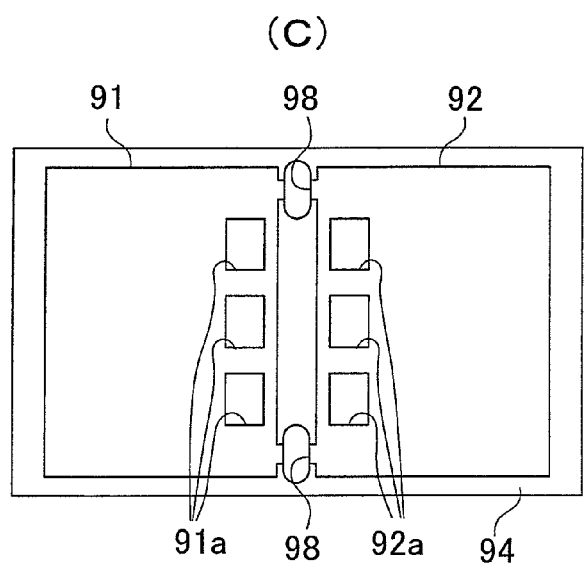

Hereinafter, a circuit board and a production method of the circuit board according to an exemplary embodiment 2 of the present invention are described referring to FIGS. 5 and 6. FIG. 5 (A) is a front view of a circuit board 10a according to the exemplary embodiment 2, and FIG. 5 (B) is a side view thereof. FIG. 6 are process drawings illustrating production processes of the circuit board 10a according to the exemplary embodiment 2.

As illustrated in FIGS. 5 (A) and (B), the circuit board 10a according to the exemplary embodiment 2 has a first circuit pattern 91 and a second circuit pattern 92 formed in a planar shape through a die-punching work applied to a copper plate having a predefined thickness. The first circuit pattern 91 and the second circuit pattern 92 are secured to an upper surface of an insulating member 94 having a plate shape by means of an adhesive 95 with no electrical conduction therebetween. The first circuit pattern 91 and the second circuit pattern 92 respectively have a predefined number of pads 91a and 92a formed in a dented shape used to mount electronic parts. A soldering agent filled into these pads 91a and 92a is used to mount electronic parts 96 between the first circuit pattern 91 and the second circuit pattern 92. A third circuit pattern 93 is secured to a lower surface of the plate-shape insulating member 94 by means of the adhesive 95. The third circuit pattern 93 is configured to provide an interlaminar electrical conduction to a predefined conducting position on the circuit pattern 91 using a penetration electrode unit not illustrated in the drawings. The third circuit pattern 93 is made of a material similar to the material of the first circuit pattern 91 and the second circuit pattern 92 and has a coefficient of linear expansion more approximate to coefficients of linear expansion of the circuit patterns 91 and 92 than a coefficient of linear expansion of the plate-shape insulating member 94.

A cured prepreg in which a core member, such as a glass cloth, is impregnated with a resin such as epoxy constitutes the plate-shape insulating member 94. The plate shape insulating member 94 has a thickness in the range of, for example, 0.4 to 4.0 mm, preferably has a thickness in the range of 0.5 to 0.8 mm.

The adhesive 95 is a silicone-based adhesive in view of adhesiveness, thermal conductivity, insulating properties, and stretching properties. The adhesive 95 has a thickness equal to or smaller than 100 μm and preferably has a thickness in the range of 40 to 50 μm. The adhesive 95 is not necessarily limited to such a silicone-based adhesive. Other examples of the adhesive 95 are an epoxy-based adhesive with a major emphasis being placed on adhesive strength, a polyimide-based adhesive with a major emphasis being placed on adhesive strength and heat resistance, and a prepreg.

The production processes of the circuit board 10a thus structurally characterized are described below referring to FIG. 6.

First, a copper plate having a predefined shape is prepared as a conductor having a plate shape used as a material. As illustrated in FIG. 6 (A), the first circuit pattern 91 having the pads 91a and the second circuit pattern 92 having the pads 92a are punched out by press work and shape-formed depending on the predefined patterns, respectively. The pads 91a and the pads 92a are formed by the press work during the formation of the patterns. In this stage, the first circuit pattern 91 and the second circuit pattern 92 are coupled with each other by two coupling sections 97. The process illustrated in FIG. 6 (A) is an example of the "first process" recited in the Scope of Claims.

After the plate-shape insulating member 94 is formed by curing the prepreg in which the core member, such as a glass cloth, is impregnated with a resin such as epoxy, the first circuit pattern 91 and the second circuit pattern 92 coupled by the coupling sections 97 are secured to the upper surface of the plate-shape insulating member 94 by means of the adhesive 95 as illustrated in FIG. 6 (B). Further, the third circuit pattern 93 similarly formed by press work is secured to the lower surface of the plate-shape insulating member 94 by means of the adhesive 95. The process illustrated in FIG. 6 (B) is an example of the "second process" recited in the Scope of Claims. The adhesive 95 may be applied to the circuit patterns 91 to 93. An adhesive formed in a sheet shape may be used as the adhesive 95.

When the couplings by the coupling sections 97 are released by, for example, forward press as illustrated in FIG. 6(C), the production of the circuit board 10a illustrated in FIG. 5 is completed. The process illustrated in FIG. 6 (C) is an example of the "third process" recited in the Scope of Claims.

As described so far, according to the production method of the circuit board 10a provided by the exemplary embodiment 2, the process illustrated in FIG. 6 (A) forms the first circuit pattern 91 and the second circuit pattern 92 from the metal plate in a planar shape in a manner that these patterns are coupled with each other by the coupling sections 97, the process illustrated in FIG. 6 (B) secures the first circuit pattern 91 and the second circuit pattern 92 to the plate-shape insulating member 94 using the adhesive 95, and the process illustrated in FIG. 6 (C) releases the couplings by the coupling sections 97.

When the circuit patterns 91 and 92 are secured to the plate-shape insulting member 94 by means of the adhesive in the process illustrated in FIG. 6 (B), the circuit patterns 91 and 92 coupled with each other by the coupling sections 97 can be secured to the plate-shape insulating member 94 with relative positions thereof remaining unchanged.

At least one of the first circuit pattern 91 and the second circuit pattern 92 may include a winding wire(s) of a coil or a transformer.

In the circuit board 10a according to the exemplary embodiment 2, the first circuit pattern 91 and the second circuit pattern 92 punched out from a plate-shape conductor in a manner that they are coupled by the coupling sections 97 are electrically isolated from each other after the coupling sections 97 are removed from these patterns respectively secured to the plate-shape insulating member 94. Therefore, a mounting surface of the first circuit pattern 91 and a mounting surface of the second circuit pattern 92 can retain a degree of planarity.

According to the production method of the circuit board 10a provided by the exemplary embodiment 2 wherein the silicone-based adhesive is used as the adhesive 95, the silicone-based adhesive having a higher stretchability than other adhesives can avoid such unfavorable events as peel-off of the adhesive and breakage of the circuit patterns in the case where the circuit patterns are deformed by a residual stress resulting from the formation of the circuit patterns.

Because the pads 91a and 92a are formed in the dented shape, the soldering agent can be prevented from flowing out of the mounting pads 91a and 92a when the pads 91a and 92a are used to mount the electronic parts 96.

The pads 91a and 92a for mounting the electronic parts are not necessarily formed in the dented shape but may be formed to be flush with peripheral portions. When the pads are formed in such a shape, the pads constitute an outermost surface because there are no portions higher than these pads. Then, a cream soldering agent, for example, can be easily applied thereto.

According to the production method of the circuit board 10a provided by the exemplary embodiment 2, the third circuit pattern 93 having a coefficient of linear expansion more approximate to the coefficients of linear expansion of the circuit patterns 91 and 92 than the coefficient of linear expansion of the plate-shape insulating member 94 is secured to the surface of the plate-shape insulating member 94 opposite to the surface where the first circuit pattern 91 and the second circuit pattern 92 are secured. This structural feature can avoid thermal deformation of the circuit board 10 caused by overly different coefficients of linear expansion. In place of the third circuit pattern 93, a member having a coefficient of linear expansion more approximate to the coefficients of linear expansion of the circuit patterns 91 and 92 than the coefficient of linear expansion of the plate-shape insulating member 94 may be secured to the lower surface of the plate-shape insulating member 94.

According to a modified example of the exemplary embodiment 2, a circuit pattern may be deposited on the first circuit pattern 91 alone by means of the adhesive 95 with the plate-shape insulating member 94 interposed therebetween to provide a plurally layered structure. In the multilayered structure thus provided, the first circuit pattern 91 and the circuit pattern deposited thereon may constitute a transformer. This makes it unnecessary to apply film deposition on all over one surface of the circuit board 10a, thereby easily providing the partly-layered circuit pattern.

Exemplary Embodiment 3

Figure 7:
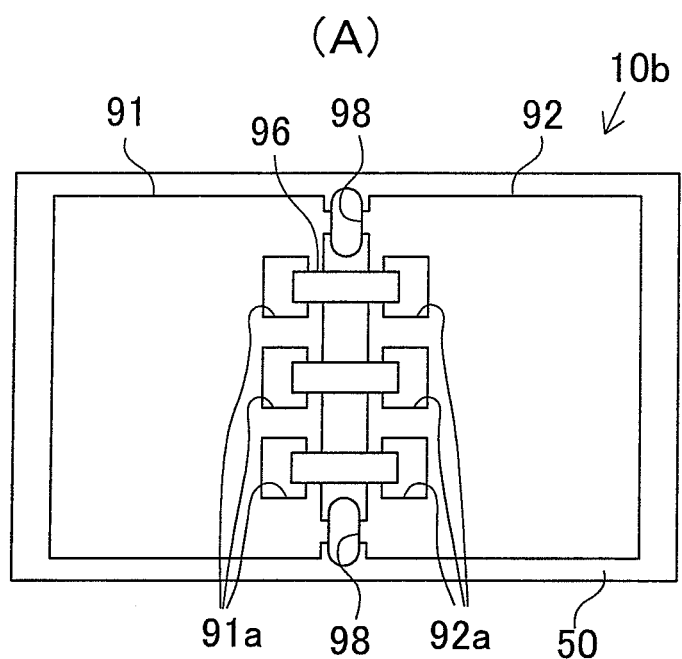
FIG. 7 are illustrations of a circuit board according to an exemplary embodiment 3, wherein FIG. 7 (A) is a front view, and FIG. 7 (B) is a side view.
Figure 7:
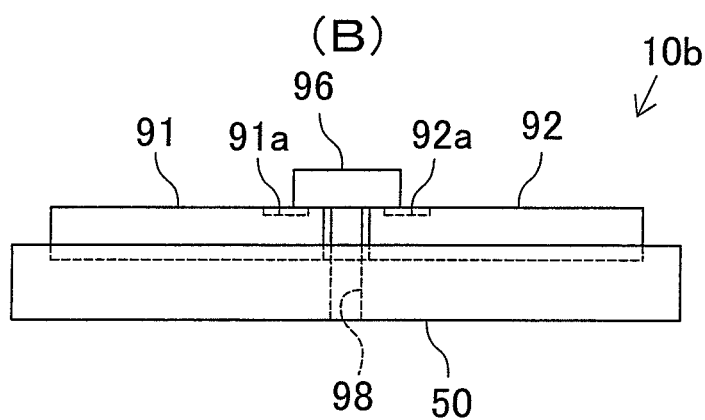

Hereinafter, a circuit board and a production method of the circuit board according to an exemplary embodiment 3 of the present invention are described referring to FIG. 7. FIG. 7 (A) is a front view of a circuit board 10b according to the exemplary embodiment 3, and FIG. 7 (B) is a side view thereof.

As illustrated in FIGS. 7 (A) and (B), the circuit board 10b according to the exemplary embodiment 3 is structurally characterized in that the resin plate 50 described in the exemplary embodiment 1 is employed in place of the plate-shape insulating member 94 and the adhesive 95 in the circuit board 10a according to the exemplary embodiment 2.

The circuit board 10b is formed in a structure where at least a part of the first circuit pattern 91 and the second circuit pattern 92 is embedded in the resin plate 50 by means of a resin flowing out of the resin plate 50 where a plurality of prepregs are stacked in a predefined number of layers.

According to the production method of the circuit board 10b provided by the exemplary embodiment 3, the first circuit pattern 91 and the second circuit pattern 92 are formed in a manner that they are coupled by the coupling sections 97 (first process), the first circuit pattern 91 and the second circuit pattern 92 are then secured to the resin plate 50 (second process), and the couplings by the coupling sections 97 are released (third process).

Accordingly, when the circuit patterns 91 and 92 can be secured to the resin plate 50 in the second process, the circuit patterns 91 and 92 thus coupled with each other by the coupling sections 97 can be secured to the resin plate 50 with relative positions thereof remaining unchanged in the event of outflow of the resin from the layered prepregs when the circuit patterns are secured.

At least one of the first circuit pattern 91 and the second circuit pattern 92 may include a winding wire(s) of a coil or a transformer.

In the first process, a metal member serving to prevent loosening of the screws, such as the metal seat 75e described in the exemplary embodiment 1, may be formed in a manner that the metal member is coupled with the first circuit pattern 91 by a support member, and the support member may be removed in the third process. Because the first circuit pattern 91 and the metal member are coupled with each other by the support member, the metal member can be located at a predefined position on the resin plate 50 with the first circuit pattern 91 in the second process, and relative positions of the metal member and the first circuit pattern 91 can be maintained. Because the third process releases the couplings by the coupling sections 97 and removes the support member, it is unnecessary to separately provide an additional process for removing the support member. This prevents deterioration of a workability possibly caused by providing the support member.

The support member may have a plurality of positioning through holes. In the second process, when pins, for example, are inserted through the through holes of the support member and through holes provided in the resin plate 50 so as to positionally match the through holes, the first circuit pattern 91 and the support member can be located with a required accuracy at predefined positions on the resin plate 50.

The support member may be formed so as to couple the second circuit pattern 92 and the metal member, and a similar operational effect can be thereby exerted.

Exemplary Embodiment 4

Figure 8:
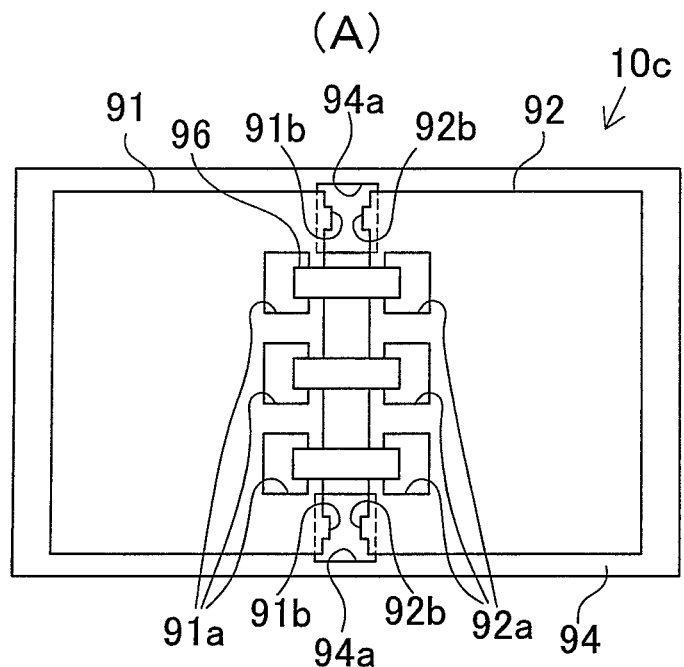
FIG. 8 (A) is a front view of a circuit board according to an exemplary embodiment 4, and FIG. 8 (B) is a side view of the circuit board.
Figure 8:
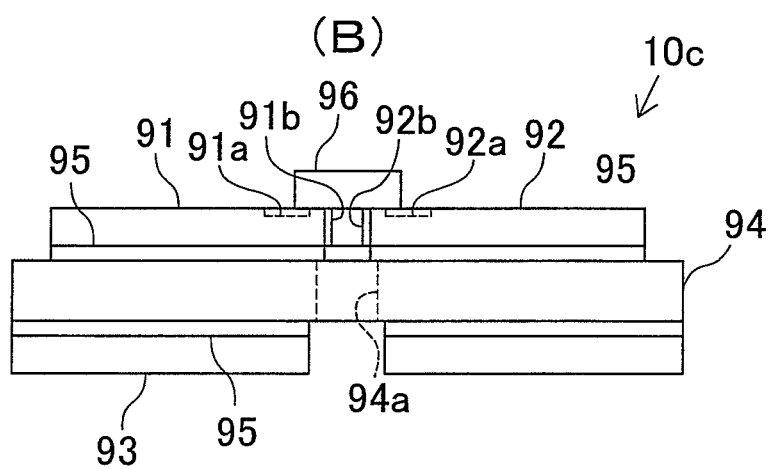
Figure 9:
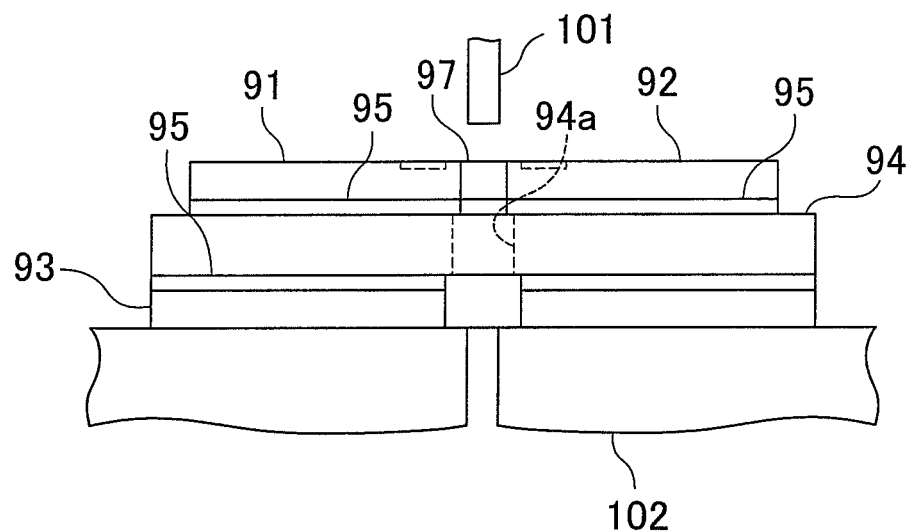
FIG. 9 are process drawings illustrating production processes of the circuit board according to the exemplary embodiment 4, wherein FIG. 9 (A) is a drawing of a state immediately before a die-punching work, and FIG. 9 (B) is a drawing of a state immediately after the die-punching work.
Figure 9:
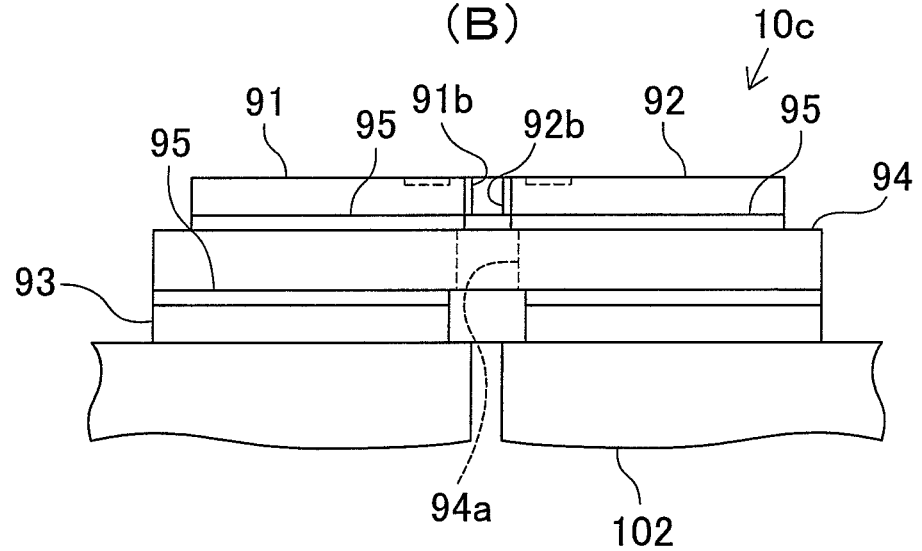

Hereinafter, a circuit board and a production method of the circuit board according to an exemplary embodiment 4 of the present invention are described referring to FIGS. 8 and 9. FIG. 8 (A) is a front view of a circuit board 10c according to the exemplary embodiment 4, and FIG. 8 (B) is a side view thereof. FIG. 9 are process drawings illustrating production processes of the circuit board 10c according to the exemplary embodiment 4, wherein FIG. 9 (A) is a drawing of a state immediately before a die-punching work, and FIG. 9 (B) is a drawing of a state immediately after the die-punching work.

As illustrated in FIGS. 8 (A) and (B), the circuit board 10c according to the exemplary embodiment 4 is different from the circuit board 10a according to the exemplary embodiment 2 in that the plate-shape insulating member 94 has a through hole 94a formed therein beforehand.

The through hole 94a is formed in the plate-shape insulating member 94 beforehand to allow a die punching tool 101 to pass through without accidentally processing the plate-shape insulating member 94 during the punching work by forward press illustrated in FIG. 6 (C) to release the couplings by the coupling sections 97.

A reason why the through hole 94a is formed beforehand in the plate-shape insulating member 94 is described below. When the tool 101 used to punch out the coupling sections 97 passes through the plate-shape insulating member 94, cut-off flakes generated when the coupling sections 97 are cut off are possibly attached to inner surfaces of the through holes. The cut-off flakes attached to the inner surfaces of the through holes may be peeled off later by, for example, vibration, possibly resulting in an electrical short circuit. To avoid the occurrence of such an electrical short circuit, the plate-shape insulating member 94 according to the exemplary embodiment 4 has the through hole 94a formed beforehand to allow the tool 101 to pass through.

According to the production method of the circuit board 10c provided by the exemplary embodiment 4, the first circuit pattern 91 and the second circuit pattern 92 are formed in a manner that these patterns are coupled with each other by the coupling sections 97, and the first circuit pattern 91 and the second circuit pattern 92 thus coupled with each other by the coupling sections 97 are secured by means of the adhesive 95 to the upper surface of the plate-shape insulating member 94 where the through hole 94a is formed. Then, the third circuit pattern 93 similarly shape-formed by press work is secured to the lower surface of the plate-shape insulating member 94 by means of the adhesive 95. As illustrated in FIG. 9 (A), the plate-shape insulating member is set on a metal die 102 for die-punching work, and the coupling sections 97 are then punched out by the tool 101 for die-punching work. As a result, the first circuit pattern 91 and the second circuit pattern 92 coupled by the coupling sections 97 are uncoupled from each other as illustrated in FIG. 9 (B). The reference symbols 91b and 92b illustrated in FIGS. 8 and 9 denote cut surfaces of the first circuit pattern 91 and the second circuit pattern 92 cut by the die-punching work.

Thus, the die-punching work removes the coupling sections 97 alone, leaving the plate-shape insulating member 94 intact. This avoids the event that any cut-off flakes are attached to the cut surfaces of the plate-shape insulating member 94.

Figure 10:
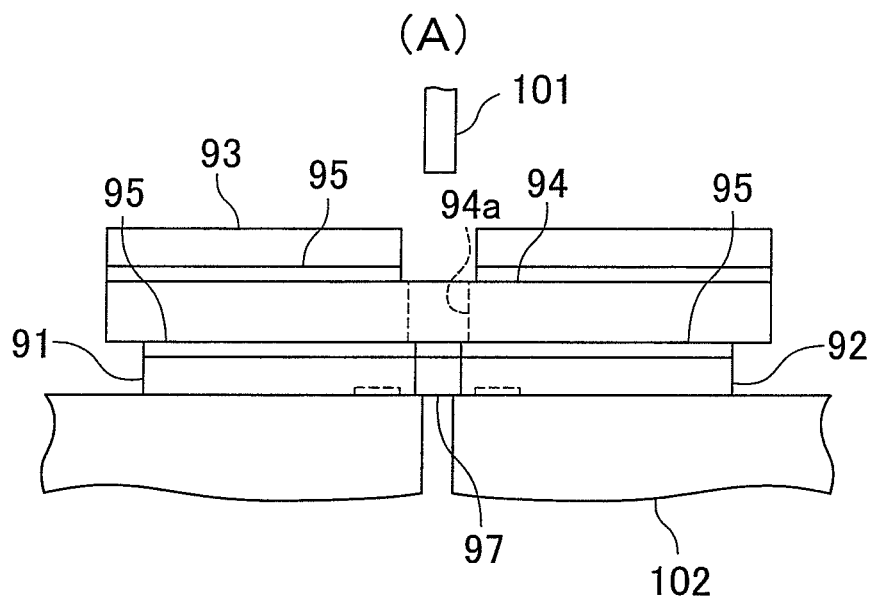
FIG. 10 are process drawings illustrating production processes of the circuit board according to a modified example of the exemplary embodiment 4, wherein FIG. 10 (A) is a drawing of a state immediately before a die-punching work, and FIG. 10 (B) is a drawing of a state immediately after the die-punching work.
Figure 10:
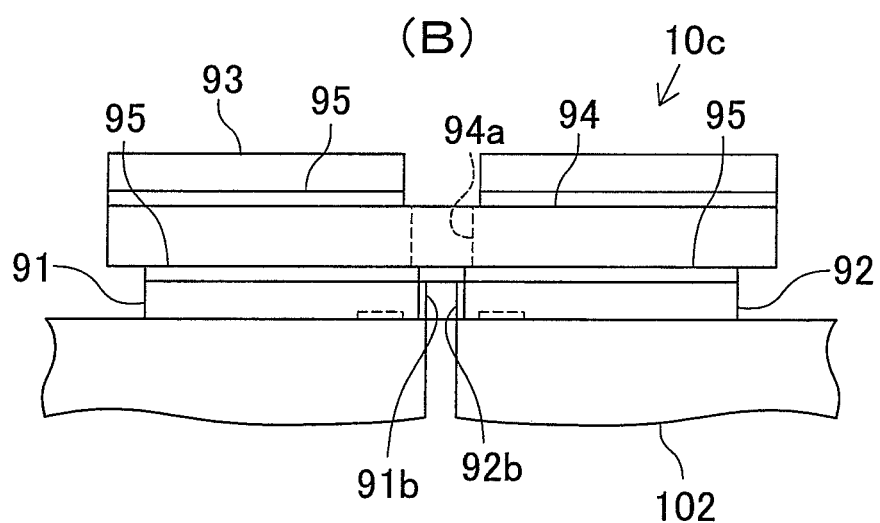

FIG. 10 are process drawings illustrating production processes of the circuit board 10c according to the exemplary embodiment 4, wherein FIG. 10 (A) is a drawing of a state immediately before die-punching work, and FIG. 10 (B) is a drawing of a state immediately after the die-punching work.

As illustrated in FIGS. 10 (A) and (B), a modified example of the exemplary embodiment 4 suggests performing the die punching with the coupling sections 97 in proximity of the metal die 102 for die-punching work. Accordingly, portions in the vicinity of cut surfaces 91b and 92b after the die-punching work (portions where the coupling sections 97 were cut off) can be directly supported by the metal die 102. This prevents the occurrence of sagging in the parts where the coupling sections 97 were cut off.

The through hole which allows the die-punching tool to pass through may be formed beforehand in the resin plate 50 according to the exemplary embodiment 1 to punch out the coupling sections 43 and 44 by the die-punching work to release the couplings by the coupling sections. Then, the exemplary embodiment 1 can achieve an operational effect similar to that of the exemplary embodiment 4. The formation of the through hole is similarly adopted in any other exemplary embodiments and their modified examples.

The present invention is not necessarily limited to the exemplary embodiments described thus far and may be embodied as described below. These suggested embodiments cam achieve an operational effect similar to those of the other exemplary embodiments.

1) The coupling section 43 is not necessarily connected to the one-side end portion 41. The coupling section 43 can similarly prevent wobbling of the one-side end portion 41 when connected to any portions in the vicinity of the one-side end portion 41. The coupling section 44 is not necessarily connected to the other-side end portion 42. The coupling section 44 can similarly prevent wobbling of the other-side end portion 42 when connected to any portions adjacent to the other-side end portion 42.

2) The winding numbers of the first coil 30 and the second coil 40 are not necessarily limited to 1 and 4.

3) The support members 81 and 82 respectively have two through holes 81a and 82a for one first coil 30. This structural feature is not the only option, and the through holes may be provided at predefined intervals in the longitudinal direction, or one each may be provided on both end portions in the longitudinal direction. Similarly, in place of providing two through holes 83a and 84a for one second coil 40 in the support members 83 and 84, the through holes may be provided at predefined intervals in the longitudinal direction, or one each may be provided on both end portions in the longitudinal direction in these support members.

4) The exemplary embodiment 1 may employ the plate-shape insulating member 94 in place of the resin plate 50, wherein the first coil 30 and the second coil 40 may be secured to the plate-shape insulating member 94 by means of the adhesive 95.

5) The circuit boards 10, 10a, 10b, and 10c are not necessarily used for high currents but may be used for low currents (for example, a few mA).

6) Though the first circuit pattern 91 and the second circuit pattern 92 are secured to the plate-shape insulating member 94 by means of the adhesive 95 (exemplary embodiment 2), or secured to the resin plate 50 where a plurality of prepregs are stacked in layers (exemplary embodiment 3) in the description given thus far, the first circuit pattern 91 and the second circuit pattern 92 may be simply secured to the plate-shape insulating member.

DESCRIPTION OF REFERENCE SYMBOLS 10, 10a, 10b, 10c circuit board
20 transformer
22a, 22b through hole
30 first coil
31 coupling section
40 second coil
41 one-side end portion
42 other-side end portion
43, 44, 45 coupling section
50 resin plate
61, 62 core
71, 72 input terminal
73, 74 output terminal
71a, 72a, 73a, 74a exposed portion
75e, 75f metal seat (first metal member)
76a, 76b, 76c, 76e, 76f metal seat
81, 82 support member (first support member)
83, 84 support member
81a to 84a through hole
91 first circuit pattern
92 second circuit pattern
94 plate-shape insulating member
94a through hole
95 adhesive
97 coupling section
101 tool
102 metal die

What is claimed is:

1. A circuit board comprising:
    an insulating member having a plate shape, and including a through hole configured to allow a die punching tool to pass through the insulating member;
    a first circuit pattern and a second circuit pattern formed by die punching of a conductor having a plate shape in a manner that the first and second circuit patterns are coupled with each other by a first coupling section;
    wherein the first circuit pattern and the second circuit pattern are secured to a front surface of the insulating member by an adhesive, wherein the first coupling section faces the through hole of the insulating member
    a third circuit pattern secured to a back surface of the insulating member by an adhesive, and
    the first coupling section is configured to be removed in order to electrically isolate the first circuit pattern and the second circuit pattern from each other after the insulating member having the through hole is secured to the first circuit pattern and the second circuit pattern.

2. The circuit board as claimed in claim 1, further including a second coupling section used to couple two different portions in the first circuit pattern.

3. The circuit board as claimed in claim 1, wherein
    a mounting pad for mounting an electronic part is formed in each of the first circuit pattern and the second circuit pattern.

4. A method for producing a circuit board having a first circuit pattern and a second circuit pattern, including:
    a first process for forming the first circuit pattern and the second circuit pattern in a manner that the first and second circuit patterns are coupled with each other by a first coupling section;
    forming a through hole in an insulating member having a plate shape prior to a second process, wherein the through hole is configured to allow a die punching tool to pass through the insulating member;
    the second process includes securing the first circuit pattern and the second circuit pattern to a first surface of the insulating member by an adhesive, so that the through hole in the insulating member faces the first coupling section, and securing a third circuit pattern to a back surface of the insulating member by an adhesive; and
    a third process for releasing the coupling by the first coupling section.

5. The method for producing the circuit board as claimed in claim 4, wherein
    the first process employs die punching of a conductor having a plate shape to form the first circuit pattern and the second circuit pattern in the manner that the first and second circuit patterns are coupled with each other by the first coupling section.

6. The method for producing the circuit board as claimed in claim 5, wherein
    a mounting pad for mounting an electronic part is provided in each of the first circuit pattern and the second circuit pattern, and
    the mounting pads are formed in the first process.

7. The method for producing the circuit board as claimed in claim 4, wherein
    the first process forms a second coupling section used to couple two different portions in the first circuit pattern, and
    the third process releases the coupling by the first coupling section and the coupling by the second coupling section.

8. The method for producing the circuit board as claimed in claim 7, wherein
the first process employs die punching of a conductor having a plate shape to form the first circuit pattern and the second circuit pattern in the manner that the first and second circuit patterns are coupled with each other by the first coupling section.

9. The method for producing the circuit board as claimed in claim 4, wherein
the third process punches out the first coupling section or the first and second coupling sections by die punching to release the coupling by the coupling section.

\* \* \* \* \*